United States Patent [19]

Wegrzyn

[11] 4,332,838
[45] Jun. 1, 1982

[54] PARTICULATE THIN FILM FABRICATION PROCESS

[76] Inventor: James E. Wegrzyn, 173 Carlton Dr. East, Shirley, N.Y. 11967

[21] Appl. No.: 190,467

[22] Filed: Sep. 24, 1980

[51] Int. Cl.$^3$ ............... B05D 5/12; H01L 31/363; H01L 21/363
[52] U.S. Cl. ............... 427/74; 427/85; 427/86; 427/87; 427/91; 427/248.1; 427/250; 427/255; 427/251; 427/255.5; 136/258
[58] Field of Search ............... 427/74, 85, 86, 87, 427/91, 248.1, 250, 251, 255, 255.5

[56] References Cited

U.S. PATENT DOCUMENTS

| | | |
|---|---|---|
| 3,441,000 | 4/1969 | Burd et al. |
| 3,926,715 | 12/1975 | Süssman |
| 3,930,067 | 12/1975 | Gorrissen |
| 3,961,997 | 6/1976 | Chu |
| 3,969,163 | 7/1976 | Wakefield |
| 3,993,533 | 11/1976 | Milnes et al. |
| 4,171,996 | 10/1979 | Maslov et al. |

OTHER PUBLICATIONS

Loferski–"Photovoltaics 1: solar-cell arrays"; Wolf–Photovoltaics II: flat panels; Backus–Photovoltaics III: concentrators; Loferski–Photovoltaics IV: advanced materials; and Carlson–Photovoltaics V: amorphous silicon cells–IEEE Spectrum, Feb. 1980 pp. 26–41.
Ehrenreich et al, "Solar photovoltaic energy", *Physics Today*, Sep. 1979 pp. 25–32.
"Crystalline thin film grows on amorphous base", *Physics Today*, Amorphous-silicon doping brightens solar--cell picture", *Physics Today*, Jan. 1977 pp. 17–19.
"New uses for amorphous silicon", pp. 1–3.

*Primary Examiner*—James R. Hoffman
*Attorney, Agent, or Firm*—Christel, Bean & Linihan

[57] ABSTRACT

A method for the fabrication of large surface area thin films of vaporizable solids upon substrate materials is provided. The method is particularly applicable to the fabrication of thin films having semiconducting properties useful as solar cells, in the production of microelectronic devices, and other similar purposes. A solid material is vaporized in a temperature-zoned furnace in association with a flowing carrier gas. The vaporized solid is allowed to condense to form an aerosol of disperse sized particles; the smaller of these particles are again vaporized leaving a lesser number of seed aerosol nuclei which are then grown to a larger size and diverted through an orifice to impact upon a substrate moving beneath the orifice thereby forming a particulate film on the substrate.

17 Claims, 4 Drawing Figures

PARTICULATE THIN FILM FABRICATION PROCESS

BACKGROUND OF THE INVENTION

This invention relates generally to the fabrication of thin films of vaporizable solids on substrates.

More specifically, this invention relates to the fabrication of thin films by impacting particles of controlled size, grown from a vapor, upon a substrate surface.

Traditional methods for the manufacture of thin films having semiconducting properties involved slicing large single-crystal ingots grown by the Czochralski process. As the ingots are generally a few square inches in cross sectional area and of round shape, this factor alone severely restricts the usefulness of such films for solar cell arrays and other large area devices. In addition, ingot growth, slicing and subsequent processing steps are high cost batch processes which are not adaptable to large scale continuous production techniques.

It is also known that many of the elements can be vapor deposited directly on substrates and that decomposable compounds may be utilized to deposit elements upon a substrate heated to a temperature above the decomposition temperature of the compounds. In the case of vapor deposition of an element upon a substrate, there is ordinarily required the maintenance of a high vacuum within the reactor. Although decomposable compounds do not necessarily require high vacuum conditions for their deposition, this technique is limited by the small selection of compounds having properties adaptable for this purpose.

Silicon in sheet form is also fabricated by pulling molten silicon into a ribbon through a narrow slit in a crucible. A generally similar technique involves formation of a ribbon by pulling a web of silicon out of a container of molten silicon. Both of these processes require contact of molten silicon with non-silicon solids with attendant problems of contamination.

SUMMARY OF THE INVENTION

Thin films of vaporizable solids are produced by impacting an aerosol onto a substrate material. The aerosol of controlled particle size is produced by vaporizing the solid in a flowing gas stream to condense the vapor, reheating the aerosol so formed to vaporize the smaller particles therein but to leave a residue of seed nucleii, again cooling the gas stream to cause growth of the seed nucelii and thereafter passing the aerosol, now containing larger particles than the first formed aerosol, through an orifice to impact upon a substrate moving relative to the orifice to deposit a particulate film of controlled thickness thereon. The film may be further treated as by annealing, passivating and doping to enhance or develop semiconducting and photovoltaic properties.

Hence, it is an object of this invention to produce thin films of controlled thickness on substrate materials.

It is another object of this invention to provide a process for the fabrication of semiconducting films unhampered by constraints of geometry or size.

Yet another object of this invention is to provide a process adapted to the semi-continuous fabrication of thin films.

Other objects, advantages and novel features will be apparent from the following description of the invention.

DISCUSSION AND DESCRIPTION OF THE INVENTION

Figure 1:
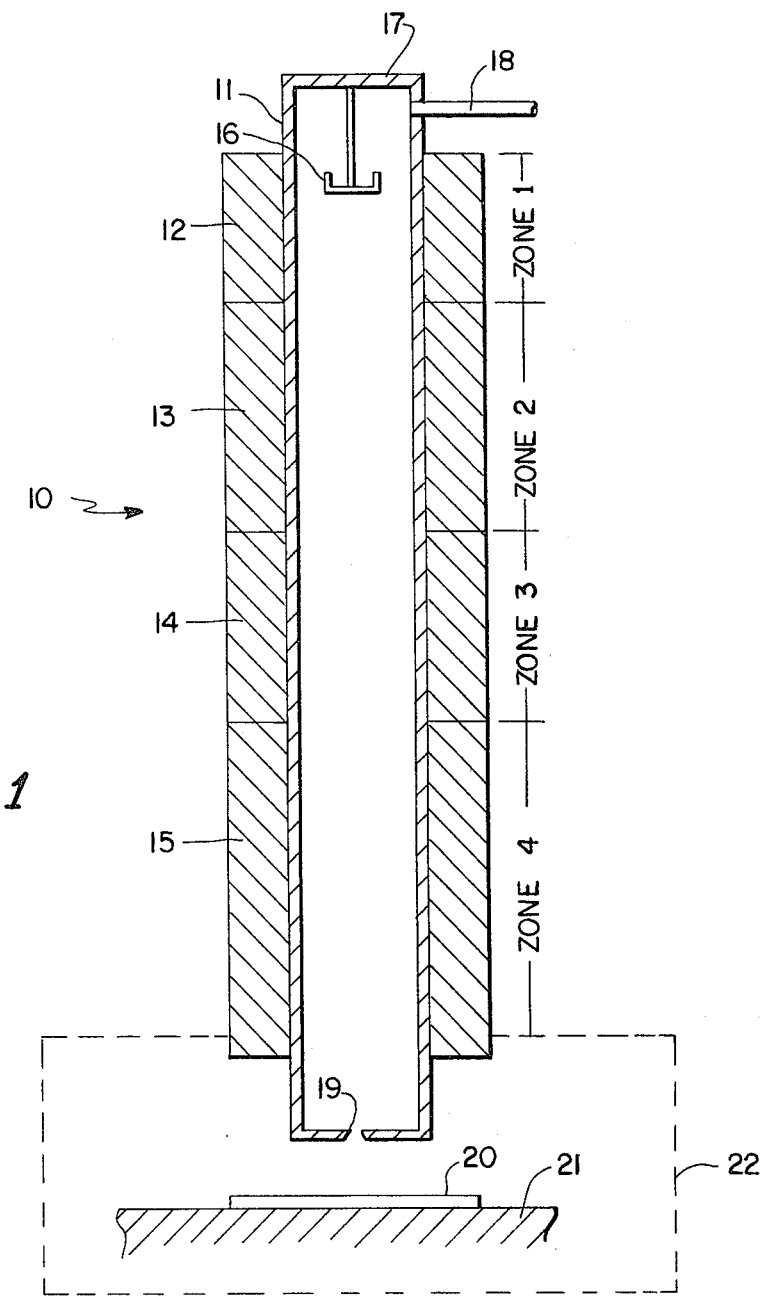
FIG. 1 depicts a partial cross sectional view of a temperature-zoned furnace adapted for use in the disclosed process.

This invention is directed to a technique for fabricating thin films; more particularly, thin films having semiconducting or photovoltaic properties. Such films are produced by vaporizing an element or compound in a stream of an inert carrier gas, cooling the vapor-laden gas sufficiently to cause condensation with the formation of a disperse size aerosol, re-evaporation of the smaller aerosol particles, a second condensation on the non-evaporated seed aerosol particles to cause particle growth and lastly, impaction of the particles upon a substrate to form a film of controlled thickness.

Referring now to the drawing, there is shown a temperature-zoned furnace 10, adapted to carry out the process of this invention. The furnace itself may conveniently be oriented in a vertical direction as shown and is lined with a refractory 11, suitably boron nitride. Individually controlled heating means 12, 13, 14 and 15, preferably of the resistance heating type, are disposed about refractory liner 11 and serve to define zones 1 to 4 respectively. Crucible 16 is disposed within zone 1 as by attachment to liner top 17. Conduit 18 communicates with the furnace interior near the top thereof to provide for the entry of the flowing carrier gas stream.

There is disposed at the bottom of the furnace an orifice 19 which is preferably in the form of a rectangular slit. Substrate 20, disposed on translatable platen means 21 is located a predetermined and preferably adjustable distance below orifice 19. Enclosure means 22 surrounds the furnace bottom and substrate so as to maintain controlled conditions of atmosphere and temperature about the substrate during deposition.

In operation, a vaporized material in elemental or in compound form is placed in crucible 16. The temperature in zone 1 is maintained at a level sufficiently above the melting of the material to cause a significant rate of evaporation. A carrier gas introduced through conduit 18 continuously sweeps the crucible to transport vaporized material out of zone 1. The carrier gas is selected to be nonreactive toward the vaporized material and preferably is a noble gas such as argon. In certain instances, addition of small concentrations of a second gas such as elemental hydrogen for passivation purposes is advantageous. The mass loading of vaporized material in the carrier gas is controlled as a function of temperature in zone 1.

Carrier gas containing vaporized material is passed from the evaporization zone, zone 1, to a first condensation zone, zone 2, which is maintained at a temperature below the melting point of the material. As it traverses zone 2, the vapor condenses into an aerosol of polydisperse sized particles having a mean diameter on the order of 0.5 microns. In comparison, smoke which results from the uncontrolled cooling of a hot vapor, typically has a mean particle diameter of 0.1 to 0.2 microns.

The aerosol passes from the first condensation zone into a reheater or re-evaporation zone, zone 3, which is maintained at a temperature above the melting point of the material, and preferably at a temperature slightly higher than that of zone 1. Temperature of zone 3 and transit time of the aerosol through zone 3 are adjusted so that a substantial fraction of the aerosol particles, those of smaller size, are again evaporated. Complete evaporation must be avoided in order to provide condensation nuclei for the regenerated vapor in the second condensation zone or zone 4.

Within zone 4 which is cooled to temperatures below the melting point of the material, the residual seed aerosol particles grow by acting as condensation sites for the vapor to reach a particle diameter on the order of 1 to 10 microns. Depending upon the material, the crystal form of the individual particles can be influenced or controlled by varying the rate of cooling along zone 4. Particles having a mean diameter above about 1 to 2 microns, and preferably having a mean diameter of about 5 microns, can be deposited in a controlled manner on essentially any type of substrate by hydrodynamic impaction.

Figure 2:
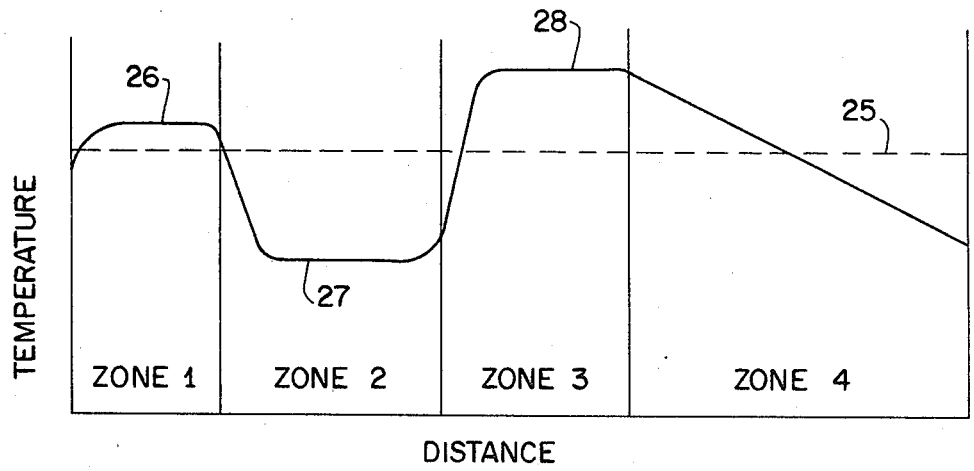
FIG. 2 is a generalized temperature profile plot of an operating furnace.

FIG. 2 illustrates a generalized profile of the temperature maintained in the four furnace zones. Line 25 denotes the material melting point. It is to be recognized that this temperature profile will vary somewhat depending upon the material used, upon the mass loading of aerosol particles desired in the carrier gas and upon the particle size range and crystalline configuration desired to be produced in zone 4. In the case of silicon, which has a melting point of about 1417° C., temperature at point 26 would typically be about 1600° C.; at point 27 about 800° C.; and, at point 28, about 1800° C.

Figure 3:
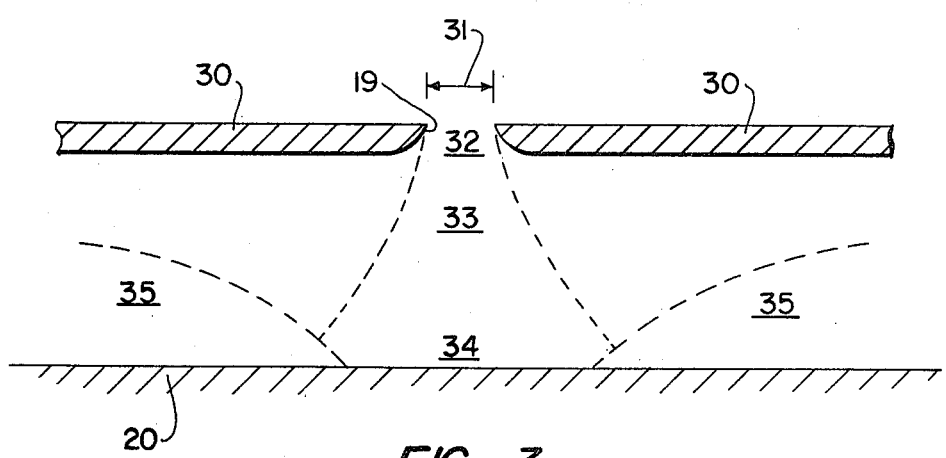
FIG. 3 is a detail view of the orifice, substrate and flow regions therebetween.

Turning now to FIG. 3, there is shown in greater detail the orifice, substrate, and the flow regions created there-between during the impact deposition of particles on a substrate. Orifice 19 preferably is formed by a pair of orifice plates 30 of knife edge configuration disposed so as to form a rectangular slit having a width 31. Orifice 19 is disposed in such a fashion that an issuing gas stream is directed perpendicularly to the flat surface of substrate 20. There results four clearly defined flow regions in the area between the orifice plates and the substrate. The first region 32 denotes the area of established orifice flow. Absolute pressure of the carrier gas at this point must be greater than about 0.5 atm for proper functioning of the process. The second region 33 defines an area of beam flow. Region 34 comprises the deflection region which typically has a width several times that of the slit. A boundary layer region 35 exists on either side of the impaction area.

Particle deposition occurs as those particles having sufficient inertia cross gas stream lines and collide with the substrate surface. This collision of particles with the substrate surface is mathematically described by the Impaction Number (I) which is a dimensionless parameter of the inertial force of a particle to its drag force defined by the following formula:

$$I = \frac{C_c D_{ae}^2 V_j}{18 \mu_f D_j} \quad (1)$$

where:
$C_c$=Cunningham slip correction factor.
$D_{ae}$=Aerodynamic diameter of the particle
$V_j$=Linear velocity of the carrier gas at the orifice
$\mu_f$=Carrier gas viscosity
$D_j$=Characteristic linear dimension of the orifice For a rectangular slit, this dimension is equal to the width of the slit.

In order to successfully deposit particles on a substrate by impaction, the distance, $Z_D$ between the orifice and substrate must be maintained such that the ratio $Z_D/D_j$ is less than about 10. Under these circumstances, and with proper choice of the various impaction parameters, only particles larger than a certain critical size will collide with the substrate surface. Smaller particles will not cross the gas stream lines and will be carried away from the deposition site along the boundary layer region. Thus, a particle grading or size sorting occurs concomitantly with the deposition.

The critical impaction parameter, Ic, which defines the cut-point between particles which do and do not impart upon the substrate, is a known constant for a rectangular jet. Thus, the minimum particle diameter which will impact upon the substrate can be determined by solving equation (1):

$$D_{ae} = \frac{I_c \, 18 \mu_f D_j}{C_c V_j} \quad (2)$$

where the terms are as previously defined. The Cunningham slip correction factor, $C_c$, has a value of unity for particles larger in diameter than about one micron and the viscosity is a function of the carrier gas employed. So, it is evident that the minimum diameter of particles impacting upon the substrate can be varied at will by controlling either the orifice width, the velocity of carrier gas through the orifice, or both.

Figure 4:
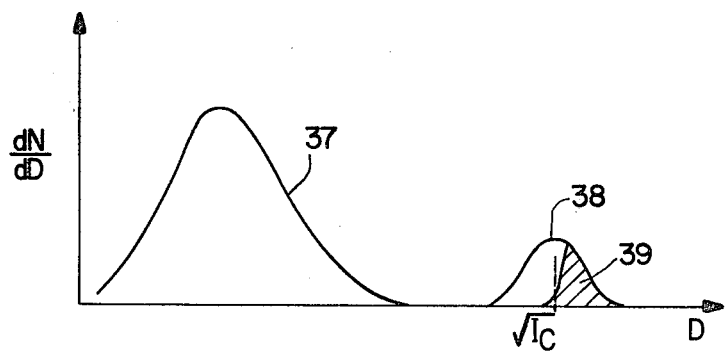
FIG. 4 is a plot illustrating a typical size distribution of particles after the first and second condensations and upon impacting upon the substrate.

FIG. 4 illustrates typical size distribution curves of the aerosol particles at various stages in the process. In the Figure, particle diameter is plotted against the differential of particle number with respect to size. Curve 37 reflects the size distribution of aerosol particles as they pass from the first condensation zone, zone 2. Curve 38 illustrates the size distribution of aerosol particles after the second condensation zone, zone 4. The shaded area 39 represents the size distribution of aerosol particles impacting upon the substrate and corresponding to the Impaction Number I. As may be appreciated from the previous discussion, area 39 may be adjusted at will by control of carrier gas velocity and/or orifice width.

This process lends itself to large scale production of thin films having properties that can be tailored at will. Film thickness, for example, can be controlled over a wide range by varying the translational speed of the substrate as it passes beneath the orifice; by varying the mass loading of aerosol particles in the carrier gas and by varying the diameter of particles impacting upon the substrate. Mono or poly layers of mono or poly disperse sized particles can be deposited upon a substrate. The substrate may be essentially any relatively high melting point material including elementary materials such as silicon and carbon, various metals, ceramics including aluminia, zirconia, quartz, various glasses, silicon nitride and the like. In short, the process allows the deposition of a film of controlled thickness and of controlled particle size on a host of substrates.

As deposited upon the substrate, the thin film of this invention comprises a layer of individual particles which may be either crystalline or amorphous. Because of the many defects associated with a film of this type, it is highly preferred to further treat the film so as to enhance its physical and electrical properties. Physical defects can be substantially reduced, or essentially eliminated by use of a number of known chemical, heat or laser annealing techniques and the film can be passivated by hydrogen or fluorine treatments as is known in the art.

Film properties desired will generally dictate the type of annealing treatment employed. For example, a thin film of silicon particles can be subjected to a high temperature recrystallization as by the zone redefining technique to obtain an essentially single crystalline film having properties similar to those displayed by films cut from a single-crystal ingot. An amorphous silicon film can be obtained by fusion and passivation at much lower temperatures. Other treatment techniques such as doping can be employed as well thus allowing semiconductor devices to be fabricated to design specifications essentially unhampered by the constraints of size or geometry.

Although preferred embodiments of this invention are directed to production of thin films having semiconducting or photovoltaic properties, the invention is not so limited. Films of catalytic metals, for example, nickel, cobalt and the like, can be formed on appropriate substrate materials such as alumina, silica-alumina and the like.

The invention is further illustrated by but not limited to the following examples which will serve to demonstrate the versatility and scope of the process.

EXAMPLE 1

The multiple zone furnace of FIG. 1 is used to deposit multi-layers of micron-sized silicon particles on a substrate to form a film on the order of 200 microns in thickness. The so-formed film is then subjected to a high temperature and pressure treatment and thereafter passivated to form an amorphous to polycrystalline sheet suitable as a base substrate for the production of semiconductor devices. Production rates are comparable to these obtained in the pulling of a ribbon from a silicon melt while high temperature contact with shaping dies, necessary in the ribbon-pulling process, is avoided.

EXAMPLE 2

The furnace of FIG. 1 is used to deposit essentially a mono layer of amorphous silicon particles having a minimum diameter of about 5 microns on a ceramic substrate. Argon is used as the carrier gas and the amorphous state of silicon particles produced in the furnace is insured by controlling zone 4 of the furnace in such a manner as to provide for rapid cooling. The film is thereafter passivated by hydrogen annealing and is doped which enhances its conductivity by several orders of magnitude.

EXAMPLE 3

Thin films of particulate silicon are prepared as in Example 2 except that zone 4 of the furnace is controlled so as to provide a slower cooling rate for the growing silicon particles thereby allowing crystallization of the individual particles.

One of the films is subjected to complete recrystallization and zone redefining at a temperature above the melting point of silicon. There is produced an essentially single crystal film of semiconductor quality. Another of the films is subjected to a high temperature annealing treatment to produce a polycrystalline film in which impurities and imperfections are concentrated along grain boundaries. The film is thereafter chemically passivated with either hydrogen or fluorine to produce a film of semiconductor quality.

EXAMPLE 4

Thin films of particulate silicon are prepared as in Example 3 except that the carrier gas velocity through the orifice is increased so as to increase the size of particles impacting upon the substrate. The substrate is translated beneath the orifice at a rate such that the deposited particles are generally spaced on and do not completely cover the substrate surface.

The film is then further treated by contacting it with the vapor of a silicon-depositing compound, i.e., silicon hydride, in sufficient amount to fuse the deposited particles together in a unitary film. The film displays properties similar to those of a film made by chemical vapor deposition techniques.

Having now fully described the invention, it will be apparent to one of ordinary skill in the art that many changes and modifications can be made thereto without departing from the spirit or scope of the described invention.

What is claimed:

1. A process for depositing a particulate thin film of a vaporizable solid upon a substrate comprising:
   vaporizing said solid in a first heating zone;
   continuously conveying vapor from said first heating zone in a flowing carrier gas stream to a first condensation zone maintained at a temperature below that of said first heating zone to form an aerosol of disperse size particles;
   passing said aerosol and said carrier gas through a second heating zone maintained at a temperature above said first condensation zone to vaporize a substantial portion, but not all, of said aerosol particles;
   passing said carrier gas, now containing a depleted number of aerosol particles and vapor of said solid, from the second heating zone to a second condensation zone;
   maintaining the temperature of said second condensation zone at a temperature below that of said second heating zone, said second condensation zone temperature being selected to cause growth of said aerosol particles by condensation of vapor thereon; and
   impacting said grown aerosol particles upon a substrate.

2. The process of claim 1 wherein said carrier gas is nonreactive toward said vaporizable solid.

3. The process of claim 1 wherein said grown aerosol particles in said carrier gas are passed through an orifice to impact perpendicularly upon the surface of said substrate.

4. The process of claim 3 wherein said orifice comprises a generally rectangular slit and wherein said substrate is translated across said slit during deposition.

5. The process of claim 4 wherein the orifice width and the velocity of carrier gas through said orifice are selected so as to preclude impaction upon the substrate of particles having a diameter less than about 1 micron.

6. The process of claim 5 wherein said vaporizable material displays semiconducting properties in film form.

7. The process of claim 6 wherein said vaporizable material is silicon.

8. The process of claim 5 wherein said vaporizable material is a metal.

9. The process of claim 5 wherein said vaporizable material is a compound.

10. The process of claim 5 wherein said film is subjected to a further treatment step.

11. The process of claim 10 wherein said treatment step comprises annealing.

12. The process of claim 10 wherein said treatment step comprises passivation.

13. The process of claim 10 wherein said treatment step comprises doping.

14. The process of claim 10 wherein said treatment step comprises recrystallization.

15. The process of claim 14 wherein said recrystallization comprises zone redefining.

16. The process of claim 5 wherein said deposited particles are amorphous.

17. The process of claim 5 wherein said deposited particles are crystalline.

* * * * *